(12) United States Patent
Sommer

(10) Patent No.: US 6,970,390 B2
(45) Date of Patent: Nov. 29, 2005

(54) DRAM MEMORY CIRCUIT WITH SENSE AMPLIFIERS

(75) Inventor: Michael Sommer, Raubling (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/850,185

(22) Filed: May 20, 2004

(65) Prior Publication Data

US 2005/0007849 A1    Jan. 13, 2005

(30) Foreign Application Priority Data

May 20, 2003    (DE) ............................... 103 22 544

(51) Int. Cl.[7] ............................................... G11C 7/00
(52) U.S. Cl. ........................ 365/205; 365/208; 327/55; 327/57
(58) Field of Search ................................ 365/205, 207, 365/208; 327/55, 57

(56) References Cited

U.S. PATENT DOCUMENTS

| | | |
|---|---|---|
| 5,701,268 A | 12/1997 | Lee et al. |
| 5,869,999 A * | 2/1999 | Mawet ........................ 330/253 |
| 6,831,513 B2 * | 12/2004 | Matsumoto et al. ........ 330/253 |

* cited by examiner

*Primary Examiner*—Son Mai
(74) *Attorney, Agent, or Firm*—Patterson & Sheridan, L.L.P.

(57) ABSTRACT

In a DRAM memory circuit, the sense amplifiers, for amplifying the differential voltage sensed between the cores of a bit line, in each case contain two transistor circuits, each of which has two switching transistors. The first transistor circuit pulls the lower potential of the sensed differential voltage down to a defined low logic potential. The second transistor circuit pulls the higher potential up to a defined high logic potential. According to the invention, all the transistors in the sense amplifier are field-effect transistors of the same conduction type, in the case of which the channel is at low impedance if the gate potential is higher than the source potential at least by the amount of the threshold voltage Vth. The second transistor circuit may contain, for each of its two switching transistors, in each case a pump circuit in order to boost the gate of that switching transistor which is intended to pull up the higher logic potential to a potential which is higher than the high logic potential by at least the amount of the threshold voltage Vth.

20 Claims, 4 Drawing Sheets

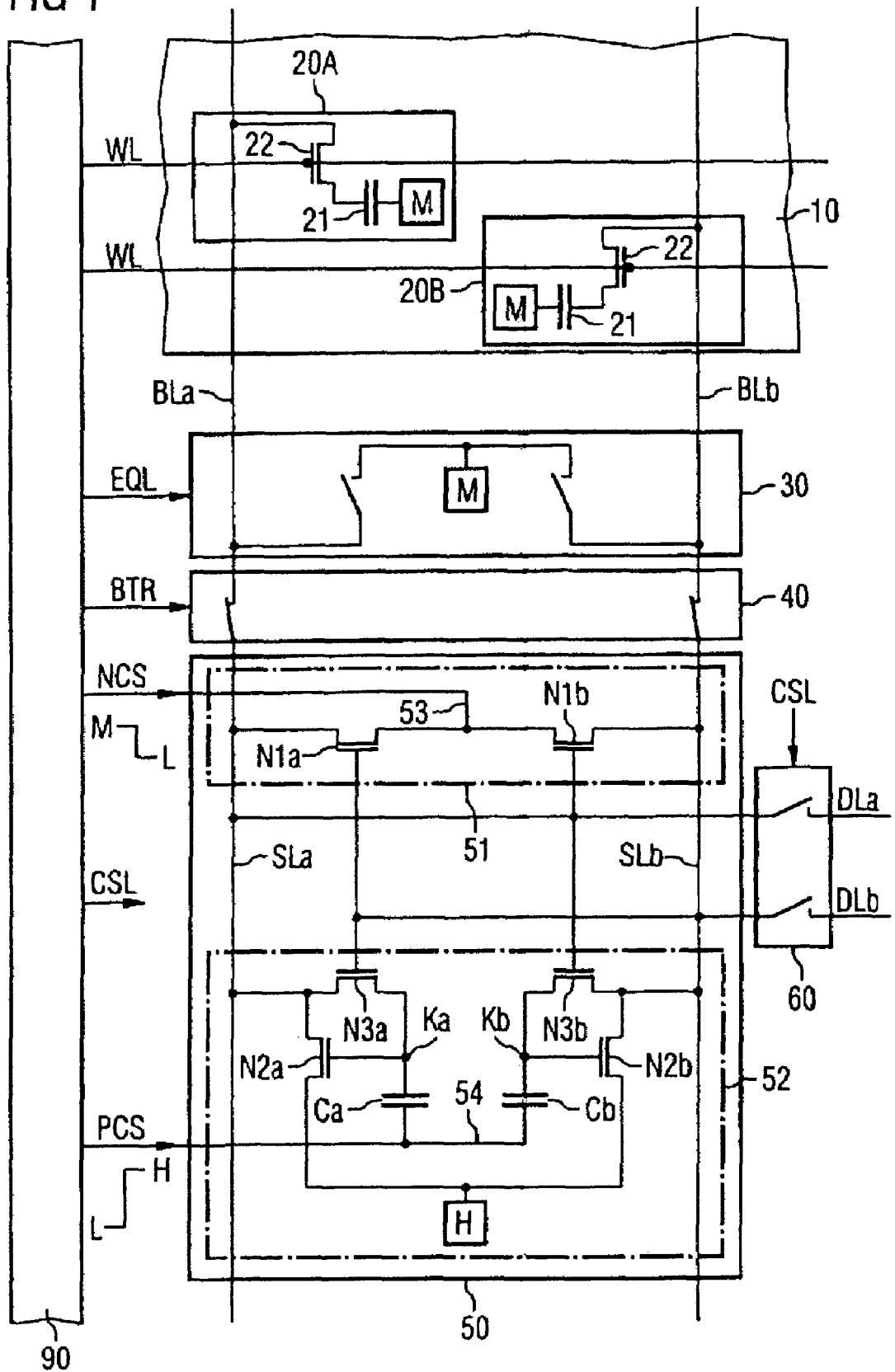

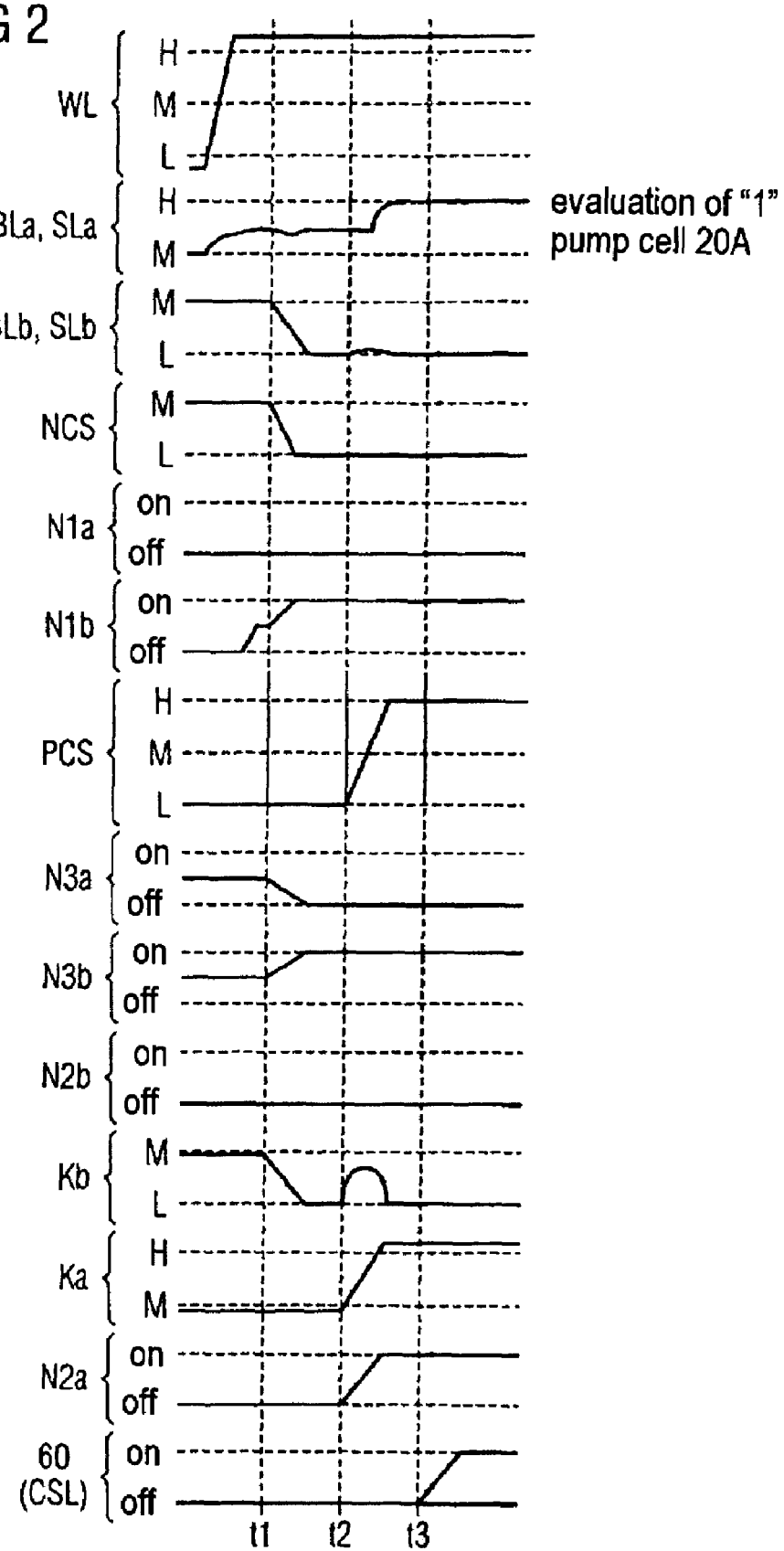

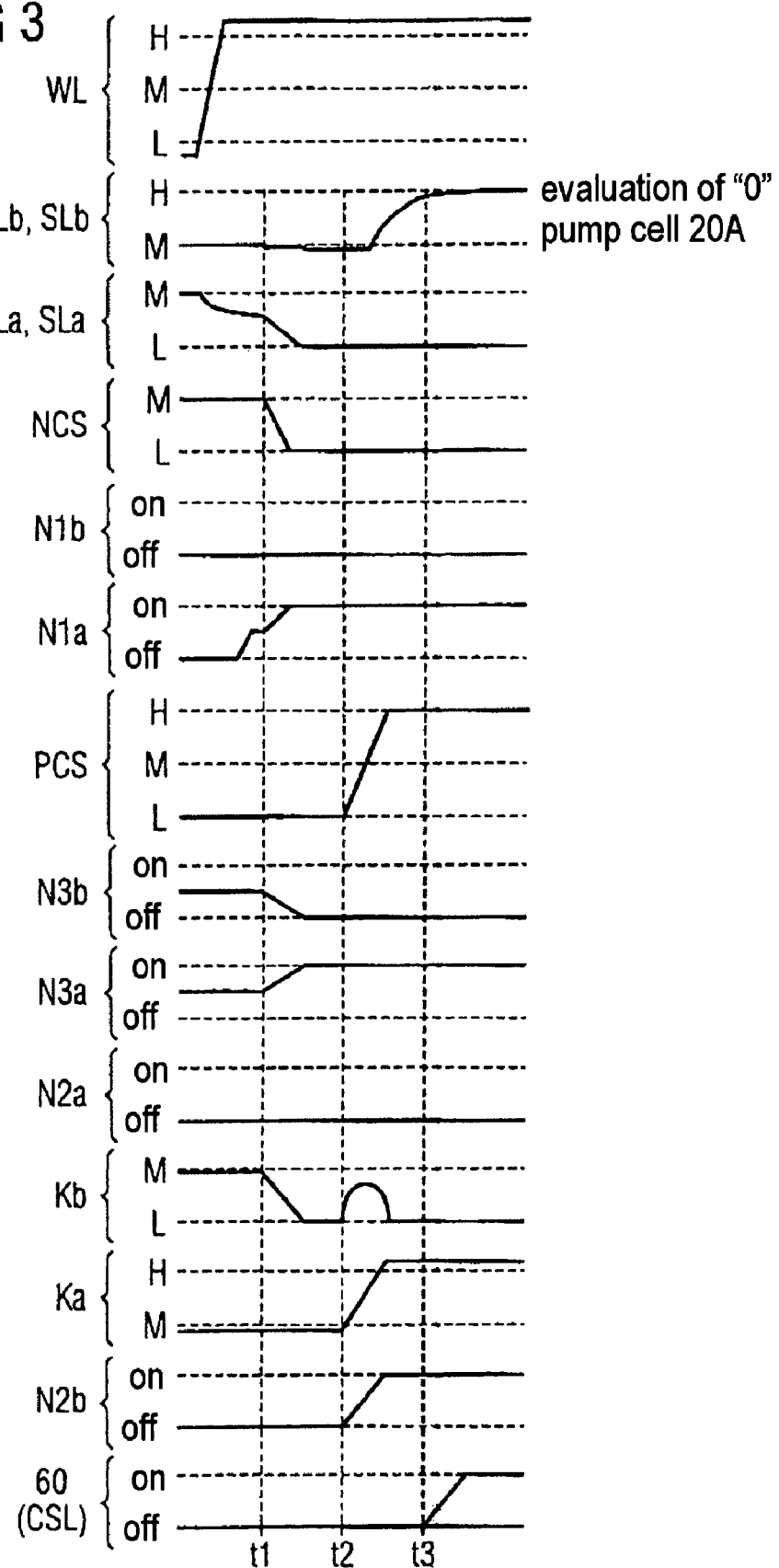

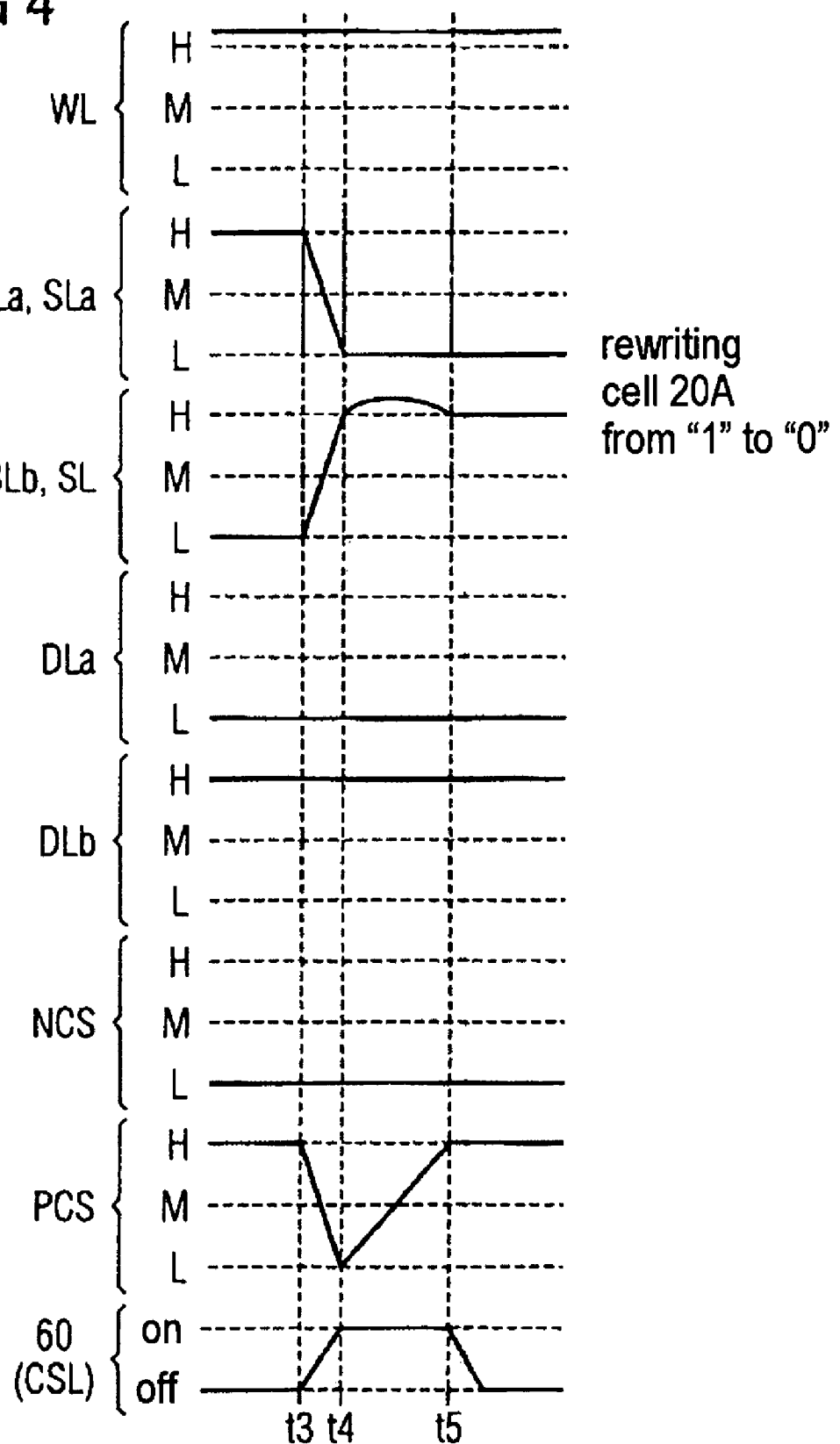

DRAM MEMORY CIRCUIT WITH SENSE AMPLIFIERS

CROSS-REFERENCE TO RELATED APPLICATIONS

This application claims foreign priority benefits under 35 U.S.C. §119 to co-pending German patent application number 103 22 544.7-55, filed May 20, 2003. This related patent application is herein incorporated by reference in its entirety.

BACKGROUND OF THE INVENTION

1. Field of the Invention

The invention relates to a DRAM memory circuit with sense amplifiers. As is known, the acronym DRAM stands for digital random access memory having a multiplicity of memory cells which are directly selectively addressable in order optionally to write in or read out binary memory data at said memory cells.

2. Description of the Related Art

DRAMs usually contain one or more cell arrays, each of which contains a multiplicity of memory cells forming a matrix-type arrangement of rows and columns. Each column is assigned a column line, which comprises two cores and is referred to as a "bit line". Each row is assigned a row select line, which is referred to as a "word line". A cell is accessed by activation of a word line in a manner dependent on a row address, as a result of which a transistor is turned on in each memory cell of the relevant row. This transistor connects the memory element of the cell to a core of the respectively assigned bit line, so that a differential voltage can be sensed between the two bit line cores, with the polarity of the differential voltage depending on the binary value of the datum stored in the relevant cell.

The differential voltage, which generally has only a relatively small magnitude, is applied for evaluation purposes to a differential amplifier which is individually assigned to the relevant bit line and is generally referred to as "sense amplifier". The function of the sense amplifier is to pull the sensed differential voltage apart in such a way that the lower potential is pulled down to a defined low logic potential and the higher potential is pulled up to a defined high logic potential. The sense amplifier contains two line rails, which can be connected to the two bit line cores, and two transistor circuits, each of which contains, for its part, two switching transistors individually assigned to the two rails. The first transistor circuit can be activated by a first switching signal in order to pull the rail of the lower potential of the sensed differential voltage down to the low logic potential via the switching transistor assigned to it. The second transistor circuit can be activated by a second switching signal in order to pull the rail of the higher potential of the sensed differential voltage up to the high logic potential via the switching transistor assigned to it.

The differential voltage amplified in this way is coupled to the memory element of the memory cell via the assigned bit line cores in order to refresh the previously stored datum. In order to forward the sensed datum to the data port of the memory circuit, a column select signal dependent on a column address is generated to close a data line switch which connects the rails of the sense amplifier of the addressed column to a two-core data line.

DRAM memory circuits are usually produced as integrated circuits on semiconductor chips, it being recommended for various known reasons to use field-effect transistors (FETs) as far as possible. This also applies to the sense amplifiers. In the sense amplifiers for those switching transistors which pull the lower potential of the sensed differential voltage down further, use has been made heretofore of field-effect transistors of that conduction type in the case of which the channel is at low impedance if the gate potential is higher than the source potential at least by the amount of the field-effect transistor threshold voltage Vth. For the switching transistors which pull the higher potential of the sensed differential voltage further up, use has been made of field-effect transistors of the opposite conduction type, in the case of which the channel is at low impedance if the gate potential is lower than the source potential at least by the amount of the field-effect transistor threshold voltage Vth. In other words, where "higher" potential means "more positive", use has been made of N-channel field-effect transistors (N-FETs) for the pull-down switching transistors and P-channel field-effect transistors (P-FETs) for the pull-up switching transistors.

In order to form field-effect transistors of different conduction types on the chip of an integrated circuit, "well" regions doped with impurity for the respectively opposite conduction type have to be created in the substrate. Each well requires, on its surface, space for the formation of the source, drain and channel zones of the field-effect transistors and for the formation of the contact for applying the required well potential. This useful space has to have a certain safety clearance with respect to the edge where the adjacent well of the other conduction type adjoins, because said edge cannot be defined with arbitrary precision with regard to the accuracy of its position and also with regard to its distinctness.

This is because during the production of the wells edge effects arise, e.g., as a result of the scattering of the doping implanting beam at photoresist edges. The doping profile at the boundary between a P-type well that is to be formed for the N-FETs and an N-type well that is to be formed for the P-FETs thus becomes ever more difficult to control with increasing miniaturization of the feature sizes. A well may, e.g., taper toward the edge or extend upward or downward. Such edge effects become apparent in an alteration of the threshold voltage of all the transistors near the edge. In a sense amplifier, a one-sided alteration of the threshold voltage may lead to an extremely undesirable asymmetry of the amplifier behavior.

The aforementioned edge effects thus make it necessary to provide a safety zone between the utilized surface of a P-type well and the utilized surface of an N-type well. This safety zone is in principle an unused space and thus undesirably increases the area requirement of the integrated circuit. The smaller the safety zones are made in order to reduce the area requirement, the greater the risk of the aforementioned asymmetry and, consequently, rejects in chip production.

SUMMARY OF THE INVENTION

The object of the invention is to provide a DRAM memory circuit with sense amplifiers which, in the case of their integration, require less unused space between their circuit elements without having to accept increased asymmetry.

Accordingly, all the transistors in each sense amplifier are field-effect transistors of the same conduction type, in the case of which the channel is at low impedance if the gate potential is higher than the source potential at least by the amount of the threshold voltage Vth. The second transistor circuit of the sense amplifier, that is to say the transistor circuit with the two pull-up switching transistors, contains, for each of said two transistors, in each case a pump circuit which, upon activation of the second transistor circuit, boosts the gate of that switching transistor which is assigned to the rail of the higher potential of the sensed differential voltage to a potential which is higher than the high logic potential by at least the amount of the threshold voltage Vth.

In the case of the sense amplifier design according to the invention, no wells of different doping types need be provided for forming the field-effect transistors, with the result that there is also no need to keep free any safety zones between such wells. The sense amplifier can be realized completely in a well and thus be constructed much more symmetrically, which will ultimately be reflected in a higher chip production yield.

In one embodiment of the invention, each pump circuit contains a capacitor via which the gate of the assigned switching transistor is connected to the source of the switching signal which serves for activating the second transistor circuit of the sense amplifier and can be changed over between the two logic potentials. Preferably, each pump circuit furthermore contains a field-effect transistor whose channel is arranged between the gate of the assigned switching transistor and the assigned rail of the sense amplifier and whose gate is connected to the other rail.

Despite the pump circuits, a sense amplifier according to the invention does not necessarily require more chip area than a known sense amplifier with field-effect transistors of different conduction types. The area requirement of the pump circuits may be small in comparison with the area requirement of the safety zones required when using field-effect transistors of different conduction types. Chip area may even be saved if all the field-effect transistors of the sense amplifier are realized as N-FETs, which, as is known, have smaller dimensions than P-FETs for the same power. The capacitors of the pump circuits may also be realized in a space-saving fashion, e.g. by deposition of a dielectric in conjunction with the contact etching.

The use of field-effect transistors of a single conduction type also has the advantage that fewer doping steps are necessary during production.

BRIEF DESCRIPTION OF THE DRAWINGS

The invention is explained in more detail below using an exemplary embodiment with reference to drawings, in which FIG. 1 schematically shows a detail from a DRAM memory circuit with a sense amplifier designed according to the invention, and FIGS. 2 to 4 show diagrams for illustrating the operation of the sense amplifier according to the invention.

DETAILED DESCRIPTION OF THE PREFERRED EMBODIMENT

For the description below and the drawings, the following notation shall apply with regard to the electrical potentials: the two logic potentials are designated by "L" for "low" and by "H" for "high". In the example described, H is positive with respect to L; the comparative "higher" thus means "more positive" and the comparative "lower" means "less positive" or "more negative".

In its upper part, FIG. 1 shows a detail from the edge region of a cell array 10 of a DRAM memory circuit. A large number of cell arrays, combined in one or more "banks", are usually integrated on a memory chip. The illustration shows the last two memory cells 20A and 20B of a column of the cell array 10 and the bit line cores BLa and BLb associated with said column. Each memory cell contains a storage capacitance (capacitor) 21, which forms the actual memory element in which a binary datum can be stored as an electrical charge. One side of the capacitor 21 is connected to a fixed potential, preferably to the "central" potential M which lies in the center between the high and low logic potential, that is to say M=(H−L)/2. The other side of the capacitor 21 is connected to a respectively assigned specimen of the bit line cores via the source-drain path (channel) of a cell selection transistor 22 formed as an N-FET. The gate of the N-FET 22 is connected to an assigned word line WL. The memory cells along a column are alternately connected to the first bit line core BLa and the second bit line core BLb. All the memory cells of a row are in each case assigned to the same word line WL.

The bit line cores BLa and BLb can be precharged to the central potential M by activation of an equalization switching device 30. The equalization switching device 30 is represented by simple switch symbols; N-FETs are usually used for the switching function. The activation is effected for the duration of the active state of an equalization control signal EQL.

The two bit line cores BLa and BLb can be connected to the two rails SLa and SLb of a sense amplifier 50 via a two-pole bit line switch 40. The switch 40 is closed (turned on) for the duration of the active state of a control signal BTR. Moreover, the two rails SLa and SLb of the sense amplifier 50 can be connected via a two-pole data line switch 60 to the two cores DLa and DLb of a data line, which, for its part, leads via (not shown) further line runs, switches, amplifiers and data buffers in a known manner to the data port of the memory circuit in order to output memory data that have been read and to input data to be written in. The switch 60 is closed for the duration of the active state of a column select signal CSL. The switches 40 and 60 are represented by simple switch symbols; here, too, N-FETs are usually used for the respective switching functions.

The sense amplifier 50 contains two transistor circuits 51 and 52, of which the first (51) comprises two N-FETs N1a and N1b. The channel of the N-FET N1a lies between one rail SLa and an activation line 53, and its gate is connected to the other rail SLb. The channel of the N-FET N1b lies between the rail SLb and the activation line 53, and its gate is connected to the rail SLa. The activation line 53 receives a first amplifier activation signal NCS, which is at L potential in the active state and at M potential in the inactive state.

The construction described up to this point is general prior art. In the prior art, the second transistor circuit comprises two P-FETs which are connected to the rails SLa and SLb in the same way as the two N-FETs N1a and N1b of the first transistor circuit 51 and receive, at their junction point, a second activation signal, which is complementary to the first activation signal NCS and is applied simultaneously with the latter.

In order to avoid the disadvantages—mentioned further above—of using field-effect transistors of different conduction types, according to the invention the second transistor circuit 52 is equipped exclusively with field-effect transistors which are of the same conduction type as the field-effect transistors N1a and N1b of the first transistor circuit 51, that is to say with N-FETs in the example described here.

The second transistor circuit 52 according to the invention as shown in FIG. 1 comprises two halves which are symmetrical with respect to one another. The left-hand half is assigned to the rail SLa and contains two N-FETs N2a and N3a and a capacitor Ca. The right-hand half is assigned to the rail SLb and contains two N-FETs N2b and N3b and a capacitor Cb. The channel of the N-FET N3a lies between the rail SLa and a circuit node Ka to which the gate of the N-FET N2a is connected, the channel of which lies between the rail SLa and an activation line 54. The channel of the N-FET N3b lies between the rail SLb and a circuit node Kb to which the gate of the N-FET N2b is connected, the channel of which lies between the rail SLb and the activation line 54. The activation line 54 receives a second amplifier activation signal PCS, which is at H potential in the active state and at L potential in the inactive state.

The activation signal for the word line WL and also the other activation and control signals EQL, BTR, NCS, PCS and CSL are supplied by the internal control device 90 of the memory circuit, in a manner dependent on external commands and address signals.

The method of operation of the entire circuit arrangement according to FIG. 1 is explained below with reference to the diagrams according to FIGS. 2 to 4. These diagrams show the temporal profile of the potentials and conductive states of various elements of the circuit arrangement according to FIG. 1 only schematically and not strictly to scale. The state "off" denotes the high-impedance (nonconducting or blocked) state of an N-FET and the state "on" denotes the low-impedance (fully conducting) state.

When a datum was written in, the assigned cell capacitor 21 was put into a charge state corresponding to the binary value of the datum by virtue of its side facing the N-FET 22 having been put at H potential (writing of a "1") or at L potential (writing of a "0"). This potential changes gradually after writing (e.g. in the direction of the M potential) because the cell capacitor 21 loses its charge due to leakage. The relevant datum can only be sensed reliably as long as the aforesaid potential remains higher or lower than M by a magnitude Δ, where Δ must have a certain minimum value.

Before the memory cells are accessed, in each case both bit line cores (in all columns) are held at the central potential M by the activated state of the equalization control signal EQL, and all the word lines WL are held at a low potential which is less than or equal to L. Consequently, the N-FET 22 in each memory cell is turned off. The bit line switches 40 are kept turned off, the first activation signal NCS for the sense amplifier 50 is held at M potential (inactive state of this signal) and the second activation signal PCS for the sense amplifier 50 is held at L potential (inactive state of this signal).

In order to initiate an access, EQL is deactivated and the word line WL of the memory cell row to be selected is then activated by being switched to a high potential which is greater than or equal to H. The N-FETs 22 in all the memory cells of the assigned row are turned on as a result of this. The bit line switches 40 at all the columns of the cell array 10 are closed (turned on), and first of all a sensing and amplifying process ensues, to be precise simultaneously in all the sense amplifiers 50 assigned to the relevant cell array 10.

Sensing and Amplifying of "1" at a Memory Cell:

The text below shall consider the case in which the memory cell 20A stores the data binary value "1". The sequence of the sensing and amplifying process is illustrated in FIG. 2.

Owing to the charge state of the cell capacitor 21 that represents the binary value "1", after the word line activation, the potential of the bit line core BLa rises from M to a higher value M+Δ; the potential of the other bit line core remains at M. The function of the sense amplifier 50 is to evaluate the sensed potential difference in the correct sense and to amplify it by pulling BLb down to the L potential and pulling BLa up to the H potential.

The pull-down of the bit line core BLb to L is done by means of the first transistor circuit 51 in the sense amplifier 50. As soon as the potential difference arising between BLa and BLb (BLa higher than BLb), which also appears at the rails SLa and SLb of the sense amplifier 50 owing to the closed bit line switch 40, reaches the magnitude Δ, the N-FET N1b becomes more conductive, while the N-FET N1a is reverse-biased to an even greater extent. At an instant t1, the first activation signal NCS for the sense amplifier 50 is then activated by being switched from M potential to L potential. This likewise pulls the rail SLb and thus the bit line core BLb, via the turned-on N-FET N1b, to L potential.

The pull-up of the other bit line core BLa to H is done by means of the second transistor circuit 52 in the sense amplifier 50. If, starting from the instant t1, the N-FET N1b of the first transistor circuit 51 pulls the bit line core BLb to L, the N-FET N3a turns off. The node Ka remains at the potential reached up to that point. This potential is M−Vth (where Vth is the FET threshold voltage) and in no way suffices to bias the gate of the N-FET N2a to an extent such that said N-FET pulls the bit line core BLa up to the H potential.

In order to raise the gate potential of N2a further, at an instant t2, which follows the instant t1 after a waiting time T1, the second activation signal PCS is switched from its until that point L potential to H potential. As a result of this, the gate potential of N2a is "boosted" via the capacitor Ca by the amount H−L, so that it reaches a level which is higher than H. This gives the FET N2a enough "Overdrive" to rapidly switch to the fully conductive state, so that the H potential propagates via its channel to the rail SLa and the bit line core BLa is pulled up to H.

The changeover of the activation signal PCS from L to H also affects the potential of the node Kb via the capacitor Cb, which potential was equal to M+Δ−Vth up to the instant t1 and was pulled to L potential upon activation of the first activation signal NCS. With the activation of the second activation signal PCS, the potential of the node Kb temporarily rises, i.e. a momentary hump arises there and allows the N-FET N3b momentarily to carry somewhat more current. Therefore, the node Kb is rapidly pulled down to L again via this field-effect transistor and the turned-on N-FET N1b of the first transistor circuit 51. The aforesaid hump does not suffice to turn on the N-FET N2b, so that the bit line core BLb remains stably at L potential.

With the successful pull-up of the bit line core BLa to H potential, the cell capacitor 21 of the memory cell 20A is fully charged, that is to say the previously stored data value "1" is written back to the cell 20A in amplified fashion, that is to say is refreshed. If only a refresh operation is to be effected, the access that has proceeded up to this point can be ended by the bit line switch 40 being opened again and the signal EQL being activated again in order to bring both bit line cores BLa and BLb to M potential again.

In order to read out the sensed and evaluated datum, the amplified data value "1" is available at the rails of the sense amplifier 50 as a pulled-apart potential difference H−L with the polarity "SLa=H, SLb=L". This potential difference can be transferred onto the data line cores DLa and DLb by virtue of the data line switch 60 being closed by means of the column select signal CSL at an instant t3, that is to say preferably after a further short waiting time, for outputting at the data port of the memory circuit.

Sensing and Evaluation of a "0" at a Memory Cell:

The text below shall consider the case in which the memory cell 20A stores the data binary value "0". The sequence of the read process is illustrated in FIG. 3.

Owing to the charge state of the cell capacitor 21 that represents the binary value "0", the bit line core BLa discharges into said capacitor, so that its potential falls from the M potential to a lower value; the potential of the other bit line core BLb remains at M. The function of the sense amplifier 50 is now to pull BLa down to the low potential L and to pull BLb up to the potential H.

This "pulling apart" of the potential difference between BLa and BLb is effected in a manner very similar to that described above for the reading of a "1", but with the roles of the circuit elements contained in the sense amplifier 50 being interchanged. In other words, the elements designated by the final letter "b", during the reading of a "0" from the memory cell 20A, operate in exactly the same way as the elements designated by the final letter "a" during the reading of a "1" from the memory cell 20A, and vice versa.

With successful pull-down of the bit line core BLa to L potential, the cell capacitor 21 is discharged again, that is to say that the previously stored data value "0" is reestablished.

For read-out, this data value is now also available at the rails of the sense amplifier 50 as a pulled-apart potential difference L–H with the polarity "SLa=L, SLb=H" and can be transferred onto the data line cores DLa and DLb by virtue of the data line switch 60 being closed by means of the column select signal CSL at an instant t3, for outputting at the data port of the memory circuit.

Write Operation

In order to write a new datum to the memory cell 20A, before the data line switch 60 is closed, the new datum is provided from the data port on the data line cores DLa and DLb as a potential difference |H–L| with a polarity that indicates the binary value of the new datum. Before the data line switch 60 is closed, first of all the same procedure as during reading is effected, with the result that the potential difference |H–L| with a polarity that indicates the binary value of the previous datum exists between the rails SLa and the SLb of the sense amplifier 50. The data line switch 60 is then closed by the column select signal CSL. If the new datum is equal to the previous datum, there is no change to the state of the sense amplifier 50, and the charge state of the cell capacitor 21 remains the same as before the closing of the switch 60.

If the new datum has a different binary value than the previous datum, the polarity of the potential difference |H–L| between the amplifier rails SLa and SLb and thus between the bit line cores BLa and BLb is reversed, so that the cell capacitor 21 assumes the charge state corresponding to the new datum. Simulations have shown that such a rewriting of the data value functions with the circuit arrangement according to FIG. 1. However, timing problems could arise in this case. This is because if the impressing voltage is taken away again as a result of the opening of the data line switch 60, then the H potential is no longer supported on the respectively "pulled-up" rail and can decrease as a result of leakage phenomena in the sense amplifier. This is not a problem if the word line WL is deactivated again early enough before this phenomenon has a noticeable effect. However, if a burst of a plurality of successive data is to be written to successively addressed memory cells of the same row ("Page" mode), the relevant word line has to remain activated for the duration of the burst. In the case of long bursts, in particular, the abovementioned leakage (unless it can be reduced to a large extent by the production technology of the components) could thus become a problem.

One way of solving this problem is, during write operation, to reset the activation signal PCS for the second transistor circuit 52 to L potential before or during incipient conductivity of the data line switch 60 and to set it to H potential again in the case of full conductivity of said switch. On account of the resetting of PCS, the potentials of both nodes Ka and Kb are pulled down to an extent such that, upon renewed setting of PCS, the desired pump effect occurs at said nodes in order to permanently turn on only one of the N-FETs N2a and N2b, to be precise exactly the one whose assigned rail SLa or SLb receives the H potential via the data line switch 60.

The diagram of FIG. 4 illustrates the above-described write operation for the exemplary case of rewriting the memory cell 20A from a previous data value "1" to the new data value "0". The instant t3 marks the instance of incipient conductivity of the data line switch 60 after the datum "0" that is to be newly written in has been applied to the data lines DLa and DLb (DLa=L, DLb=H). This instant is preceded by the history shown in FIG. 2, that is to say the sensing, evaluation and writing-back of the "1" stored in the memory cell 20A. Accordingly, directly prior to the instant t3 in FIG. 4, the assigned word line WL is activated (greater than or equal to H), the first sense amplifier activation signal NCS is active (L potential), the second sense amplifier activation signal PCS is active (H potential), BLa is at H potential and BLb is at L potential. The N-FET N2a is conductive ("on"), and the data line switch 60 is still turned off ("off").

At the instant t3, PCS is switched to L potential, so that the potential at the nodes Ka and Kb decreases and brings the N-FETs N2a and N2b into the off state. At the same time, CSL is activated, so that the data line switch 60 starts to conduct. As a result of this, BLa goes to L potential and BLb goes to H potential, so that the "0" present on the data line cores DLa and DLb is written to the memory cell 20A. Afterward, at the instant t4, PCS is switched to H again, so that the potential of Kb or Ka rises again beyond H, on account of the pump effect of the capacitors Ca and Cb. The N-FET N3b is turned on and also transfers the higher-than-H potential of the node Ka onto the bit line core BLb, which leads to a potential hump on BLb. This is the reason why the rising edge of PCS is less steep than the previous falling edge.

After the hump, that is to say when BLb has returned to H, the N-FET N2b is turned on and connects BLb permanently to the H potential. The N-FET N2a remains turned off. This state of the sense amplifier 50 is maintained even if the data line switch 60 is opened again. If a single reset-set operation of the signal PCS is insufficient for the pump effect sought, this operation can also be implemented a number of times in succession.

If the memory cell 20A originally contains the data value "0" and the new data value is "1", the write operation proceeds in a similar manner to that described, the roles of the elements designated by the final letter "b" and the elements designated by the final letter "a" being interchanged.

In general, it is also possible in write operation to close the data line switch or switches 60 for the first address of a write data burst (or for the sole write address if burst operation is not effected) by means of the assigned column select signal CSL as early as before or at the latest at the instant t2 (FIG. 2 or 3), that is to say before or at the latest at the same time as the changeover of the signal PCS from L to H. The provision of the datum to be written in on the data line cores DLa and DLb and the closing of the switch 60 may be initiated as early as at the same time as the word line activation (or very shortly afterward). This significantly accelerates the beginning of write operation. The temporary resetting of the switching signal PCS as described with reference to FIG. 4 may be obviated if no burst operation is effected during writing.

Read-write accesses to a memory cell 20A connected to the bit line core BLa have been described above. Accesses to a memory cell 20B connected to the other bit line core BLb function in the same way, of course, with interchanged roles of the elements designated by the final letter "b" and the elements designated by the final letter "a".

In the circuit arrangement according to FIG. 1, all the field-effect transistors of the sense amplifier 50 are of the same conduction type. Consequently, wells of different doping types do not have to be created in the substrate of the integrated circuit for the integration of the field-effect transistors. All the field-effect transistors of the sense amplifier can be formed in the same well, which reduces the area requirement. In the exemplary embodiment illustrated and described, the sense amplifier contains exclusively N-FETs, preferably N-channel MOSFETs. However, exclusively P-FETs may also be used instead. In this case, the potentials H and L are to be chosen such that H is negative with respect to L and, consequently, "higher" is to be understood in the sense of "more negative".

The design of the pump circuits for the driving of the respective "pull-up" N-FETs N2*a* or N2*b* as illustrated in FIG. 1 is only an exemplary embodiment. The invention also encompasses arbitrary other embodiments which can bring a field-effect effect transistor of a specific conduction type into overdrive by boosting its gate without using a field-effect transistor of the opposite conduction type.

What is claimed is:

1. An amplifier circuit, comprising:
at least two line rails for receiving a differential voltage signal which will cause one of the at least two line rails to be at a higher potential relative to the other line rail which will be at a lower potential;
first and second transistor circuits, each containing at least two switching transistors individually assigned to the at least two line rails, wherein the first transistor circuit is activated by a first switching signal in order to pull the line rail at the lower potential down to a defined low logic potential via the switching transistor assigned to that line rail, the second transistor circuit is activated by a second switching signal in order to pull the line rail at the higher potential up to a defined high logic potential via the switching transistor assigned to that line rail, and all the transistors of the at least two transistor circuits are field effect transistors (FETs) of the same conduction type; and
for each of the two switching transistors of the second transistor circuit, a pump circuit assigned thereto which, upon activation of the second transistor circuit, boosts the gate of the switching transistor which is assigned to the line rail at the higher potential to a potential which is higher than the defined high logic potential by at least the amount of its threshold voltage.

2. The amplifier circuit of claim 1, wherein each pump circuit comprises a capacitor via which the gate of the assigned switching transistor is connected to the source of the second switching signal.

3. The amplifier circuit of claim 2, wherein each pump circuit further comprises a field-effect transistor whose channel is arranged between the gate of the assigned switching transistor and the assigned line rail and whose gate is connected to the other line rail.

4. The amplifier circuit of claim 3, wherein:
the channel of each of the two switching transistors of the first transistor circuit is arranged between the respectively assigned line rail and the source of the first switching signal; and
the gate of each of the two switching transistors is connected to the respective other line rail.

5. The amplifier circuit of claim 1, wherein all the field-effect transistors (FETs) are N-channel field effect transistors (NFETs).

6. A dynamic random access memory (DRAM) device, comprising:
one or more arrays of memory cells arranged in rows and columns, wherein each column is assigned a bit line having two cores and each row is assigned a word line; and
for each column, a sense amplifier having two line rails for receiving a differential voltage signal generated between the two cores of a corresponding assigned bit line when a memory cell is connected thereto via activation of a corresponding wordline, and a plurality of field effect transistors (FETs) of the same conductive type for amplifying the differential voltage signal by pulling a line rail at a lower potential relative to the other down to a defined low logic potential and pulling a line rail at a higher potential relative to the other up to a defined high logic potential.

7. The DRAM device of claim 6, further comprising, for each sense amplifier, one or more pump circuits for boosting the voltage applied to a gate of at least one of the plurality of field effect transistors to a potential greater than the defined high logic potential by at least a threshold voltage thereof.

8. The DRAM device of claim 7, wherein the one or more pump circuits each comprises at least one capacitor.

9. The DRAM device of claim 6, wherein each of the plurality of field effect transistors is an N-channel field effect transistor (NFET).

10. A dynamic random access memory (DRAM) device, comprising:
one or more arrays of memory cells arranged in rows and columns, wherein each column is assigned a bit line having two cores and each row is assigned a word line; and
for each column:
a sense amplifier having two line rails for receiving a differential voltage signal generated between the two cores of a corresponding assigned bit line when a memory cell is connected thereto via activation of a corresponding wordline;
first and second transistor circuits, each containing at least two switching transistors individually assigned to the at least two line rails, wherein the first transistor circuit is activated by a first switching signal in order to pull a line rail at the lower potential relative to the other down to a defined low logic potential via the switching transistor assigned to that line rail, the second transistor circuit is activated by a second switching signal in order to pull line rail at a higher potential relative to the other up to a defined high logic potential via the switching transistor assigned to that line rail, and all the transistors of the at least two transistor circuits are field effect transistors (FETs) of the same conduction type; and for each of the two switching transistors of the second transistor circuit, a pump circuit assigned thereto which, upon activation of the second transistor circuit, boosts the gate of the switching transistor which is assigned to the line rail at the higher potential relative to the other to a potential which is higher than the defined high logic potential by at least the amount of its threshold voltage.

11. The DRAM device of claim 10, wherein each pump circuit comprises a capacitor via which the gate of the assigned switching transistor is connected to the source of the second switching signal which can be changed over between the high and low logic potentials.

12. The DRAM device of claim of claim 11, wherein each pump circuit further comprises a field-effect transistor whose channel is arranged between the gate of the assigned switching transistor and the assigned line rail and whose gate is connected to the other line rail.

13. The DRAM device of claim of claim 12, wherein:
the channel of each of the two switching transistors of the first transistor circuit is arranged between the respectively assigned line rail and the source of the first switching signal; and
the gate of each of the two switching transistors is connected to the respective other line rail.

14. The DRAM device of claim of claim 10, wherein all the field-effect transistors (FETs) are N-channel field effect transistors (NFETs).

15. The DRAM device of claim 10, further comprising a control device controlling access to a selected memory cell of the cell array, wherein the control device is configured to, prior to a cell access, keep the bit line cores of each column of the cell array isolated from the respectively assigned sense amplifier and to hold them at central potential, hold the first switching signal at the central potential, and hold the second switching signal at the low logic potential.

16. The DRAM device of claim 15, wherein the control device is further configured to, for initiation of a cell access, decouple the bit line cores from the central potential and activate the word line connected to the selected memory cell.

17. The DRAM device of claim 16, wherein the control device is further configured to, subsequent to activating the word line connected to the selected memory cell:
connect the bit line cores of each column to the line rails of the respectively assigned sense amplifier and to switch the first switching signal to low logic potential; and
after a wait period, raise the second switching signal to the high logic potential.

18. The DRAM device of claim 15, wherein the control device is further configured to, in a read operation, connect the line rails of the sense amplifier to the cores of a data line after or at the same time as the raising of the second switching signal to the high logic potential.

19. The DRAM device of claim 18, wherein the control device is further configured to, in write operation, connect the line rails of the sense amplifier to the cores of an assigned data line on which the datum to be written in via the relevant sense amplifier is present as a potential difference with a polarity that indicates the binary value of said datum.

20. The DRAM device of claim 18, wherein the control device is further configured to, in write operation, to reset the second switching signal after raising it to the high logic potential at least once to the low logic potential and subsequently to raise it to high logic potential again if the connection of the line rails of the sense amplifier to the cores of the assigned data line is produced.

* * * * *